United States Patent
Park

(10) Patent No.: US 7,294,524 B2
(45) Date of Patent: Nov. 13, 2007

(54) METHOD FOR FABRICATING IMAGE SENSOR WITHOUT LTO-BASED PASSIVATION LAYER

(75) Inventor: Sang-Hyuk Park, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 0 days.

(21) Appl. No.: 11/515,804

(22) Filed: Sep. 6, 2006

(65) Prior Publication Data
US 2007/0037314 A1 Feb. 15, 2007

(30) Foreign Application Priority Data
Sep. 8, 2005 (KR) .................. 10-2005-0083683

(51) Int. Cl.
*H01L 21/00* (2006.01)
(52) U.S. Cl. .................. 438/57; 438/70; 257/E31.121; 257/E31.124; 257/E31.127
(58) Field of Classification Search .................. 438/57, 438/70, 98; 257/E31.121, E31.124, E31.127
See application file for complete search history.

(56) References Cited

U.S. PATENT DOCUMENTS

| | | | |
|---|---|---|---|
| 6,344,369 B1 * | 2/2002 | Huang et al. | 438/70 |
| 6,632,700 B1 * | 10/2003 | Fan et al. | 438/70 |
| 2005/0101043 A1 * | 5/2005 | Chen et al. | 438/30 |
| 2005/0269656 A1 * | 12/2005 | Shian-Ching et al. | 257/440 |
| 2006/0146230 A1 * | 7/2006 | Joon | 349/80 |

* cited by examiner

*Primary Examiner*—Trung Dang
(74) *Attorney, Agent, or Firm*—Morgan, Lewis & Bockius LLP

(57) ABSTRACT

A method for fabricating an image sensor including a first region, which is a light receiving region, and a second region, which is a pad region, includes forming a metal line in the second region over a substrate structure comprising a photodiode, forming a passivation layer over the substrate structure, selectively etching the passivation layer to form an opening exposing the metal line where a pad contact is to be formed, forming a first over coating layer (OCL1) in the first region while forming an over coating layer (OCL) plug over the opening in the second region, forming color filters, a second over coating layer (OCL2), and micro lenses in sequential order over the OCL1 in the first region, forming a photoresist pattern exposing the OCL plug, performing an etch-back process to remove the OCL plug, and removing the photoresist pattern.

20 Claims, 9 Drawing Sheets

METHOD FOR FABRICATING IMAGE SENSOR WITHOUT LTO-BASED PASSIVATION LAYER

FIELD OF THE INVENTION

The present invention relates to an image sensor, and more particularly, to a method for fabricating an image sensor, wherein a pad and a micro lens can be formed without using a low temperature oxide (LTO) layer generally used as a passivation layer for the micro lens.

DESCRIPTION OF RELATED ARTS

Complementary metal-oxide semiconductor (CMOS) image sensor is a widely used device in mobile phones, personal computers, cameras, and other electronic devices. The CMOS image sensor is easier to operate than a typical charge coupled device (CCD), and allows a system-on-a-chip (SOC) by integrating signal processing circuits on a single chip, resulting in micronization of modules. Also, the CMOS image sensor allows using a previously set up CMOS technology with compatibility, and thus, a production cost can be decreased.

FIGS. 1A to 1D illustrate cross-sectional views to describe a typical pad fabrication process of an image sensor.

Referring to FIG. 1A, a metal line 101 is formed over a bottom structure (not shown). The bottom structure includes various elements for configuring an image sensor, such as photodiodes and transistors. The metal line 101 is the uppermost metal line contacting a pad, and includes a metal, e.g. aluminum (Al).

An etch stop layer 102 formed over the metal line 101 is patterned simultaneously when the metal line 101 is formed. The etch stop layer 102 is formed to stop etching during an etching process for forming a pad contact. The etch stop layer 102 includes a nitride layer.

An oxide layer 103 and a nitride layer 104 configuring a passivation layer are sequentially formed over the resultant substrate structure. The oxide layer 103 configuring the passivation layer at the bottom includes one selected from a group consisting of tetraethyl orthosilicate (TEOS) layer, formed by employing a plasma enhanced chemical vapor deposition (PECVD) method (hereinafter referred to as a PE-TEOS layer), an undoped silicate glass (USG) layer, and a fluorine doped silicate glass (FSG) layer. The nitride layer 104 includes one of silicon nitride ($Si_3N_4$) and silicon oxynitride (SiON). The passivation layer may include a stack structure of the oxide layer 103 and the nitride layer 104 or a single layer structure.

A photoresist pattern 105 for forming the pad is formed over the nitride layer 104. The photoresist pattern 105 exposes an upper portion of the metal line 101 where the pad contact is to be formed.

Reference letter 'A' represents a pad region, and reference letter 'B' represents a unit pixel region.

Referring to FIG. 1B, the nitride layer 104 is etched using the photoresist pattern 105 as an etch mask to define a pad region 106. At this time, a portion of the oxide layer 103 or the entire oxide layer 103 may be etched away. An ashing process using oxygen ($O_2$) plasma is performed to remove the photoresist pattern 105.

A first over coating layer (OCL1) 107, color filters 108, a second over coating layer (OCL2) 109, and micro lenses 110 are formed in the unit pixel region B. The OCL1 107 and the OCL2 109 are formed to improve the flatness of bottom structures formed below the color filters 108 and the micro lenses 110.

Referring to FIG. 1C, a low temperature oxide (LTO) layer 111 is formed over the resultant substrate structure. Another photoresist pattern 112 for use in the pad formation is formed over the LTO layer 111.

Referring to FIG. 1D, the LTO layer 111, the oxide layer 103, and the etch stop layer 102 are etched using the other photoresist pattern 112 as an etch mask to form an opening 113 exposing the metal line 101. An ashing process using $O_2$ plasma is performed to remove the other photoresist pattern 112. A pad contact formation process is subsequently performed through the opening 113.

A light receiving unit integrating external light into a photodiode is important when embodying an image sensor device. The light receiving unit is configured with color filter arrays and micro lenses. Thus, a passivation layer is often required to form over the color filter arrays and micro lenses for physical and chemical protection.

After color filter arrays and micro lenses of a typical CMOS image sensor are formed, an LTO layer, i.e., the LTO layer 111, is formed to protect the color filter arrays and the micro lenses from external damage factors such as moisture, particles, and slight thermal stress. The LTO layer is formed at a low temperature, and thus, the micro lenses may not deform.

FIG. 2 illustrates a micrographic view of the typical micro lens damaged by the above mentioned external damage factors as denoted with reference letter 'X'.

It is generally essential to use the LTO layer 111 to prevent damage in the micro lenses 110. However, the micro lenses 110 are protruded in a round structure as shown in FIG. 1D, and consequently, weak points occur in boundary regions because of a step coverage characteristic when forming the LTO layer 111.

A step coverage of the LTO layer 111 is very poor at the boundary regions when forming the LTO layer 111. Consequently, cracks may easily be generated at the boundary regions. When a small crack is generated at a boundary region, plasma used during a plasma treatment for removing the other photoresist pattern 112 causes an inflow of $O_2$ plasma into the micro lenses 110 and the OCL2 109 including photoresist.

FIGS. 3A and 3B illustrate cross-sectional views of a peeling of the LTO layer 111 generated during the plasma treatment for removing the other photoresist pattern 112.

Referring to FIG. 3A, reference letter 'Y' represents a region where damage is generated by $O_2$ plasma during the plasma treatment for removing the other photoresist pattern 112. The region 'Y' is formed by a small crack generated at a boundary region between the LTO layer 111 and the metal line 101 due to a defective step coverage while forming the LTO layer 111.

Referring to FIG. 3B, a space is generated between the nitride layer 104 and the LTO layer 111 because of the damage occurred by the $O_2$ plasma. The LTO layer 111 peels off through this space during a subsequent package process as denoted with reference letter 'Z'.

In CMOS image sensors having a line width of 0.13 µm or below, it has become generally essential to decrease a channel of light from a micro lens to a photodiode. Since the LTO layer increases the channel of light, a fabrication method of an image sensor which does not require the LTO layer is generally demanded.

SUMMARY OF THE INVENTION

It is, therefore, an object of the present invention to provide a method for fabricating an image sensor without using a passivation layer for micro lenses.

In accordance with an aspect of the present invention, there is provided a method for fabricating an image sensor including a first region, which is a light receiving region, and a second region, which is a pad region, the method including: forming a metal line in the second region over a substrate structure comprising a photodiode; forming a passivation layer over the substrate structure; selectively etching the passivation layer to form an opening exposing the metal line where a pad contact is to be formed; forming a first over coating layer (OCL1) in the first region while forming an over coating layer (OCL) plug over the opening in the second region; forming color filters, a second over coating layer (OCL2), and micro lenses in sequential order over the OCL1 in the first region; forming a photoresist pattern exposing the OCL plug; performing an etch-back process to remove the OCL plug; and removing the photoresist pattern.

In accordance with another aspect of the present invention, there is provided a method for fabricating an image sensor including a first region, which is a light receiving region, and a second region, which is a pad region, the method including: forming a metal line in the second region over a substrate structure comprising a photodiode; forming a passivation layer over the substrate structure; selectively etching the passivation layer to form an opening exposing the metal line where a pad contact is to be formed; forming color filters over the passivation layer in the first region and forming a color filter plug over the opening in the second region while forming a first color filter of the color filters; sequentially forming an over coating layer (OCL) and micro lenses over the color filters in the first region; forming a photoresist pattern exposing the color filter plug; performing an etch-back process to remove the color filter plug; and removing the photoresist pattern.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Figure 1A:
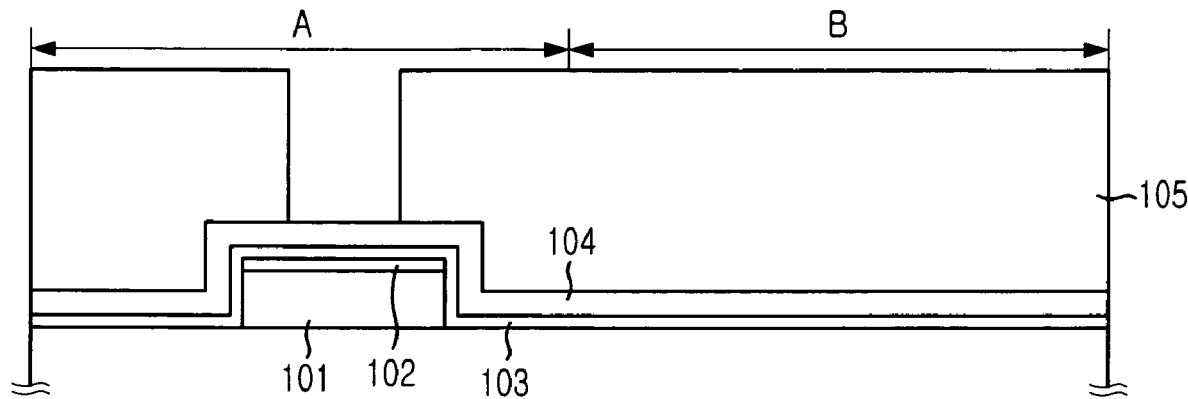
FIGS. 1A to 1D illustrate cross-sectional views to describe a typical pad fabrication process of an image sensor.
Figure 1B:
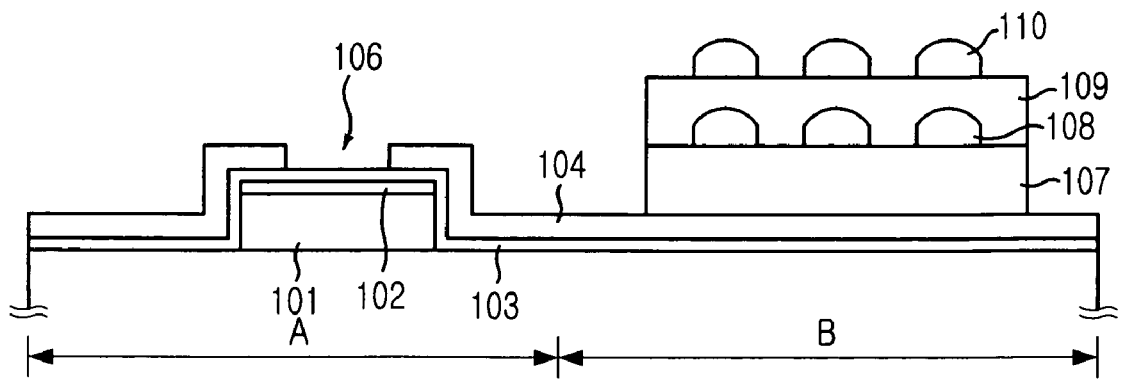
Figure 1C:
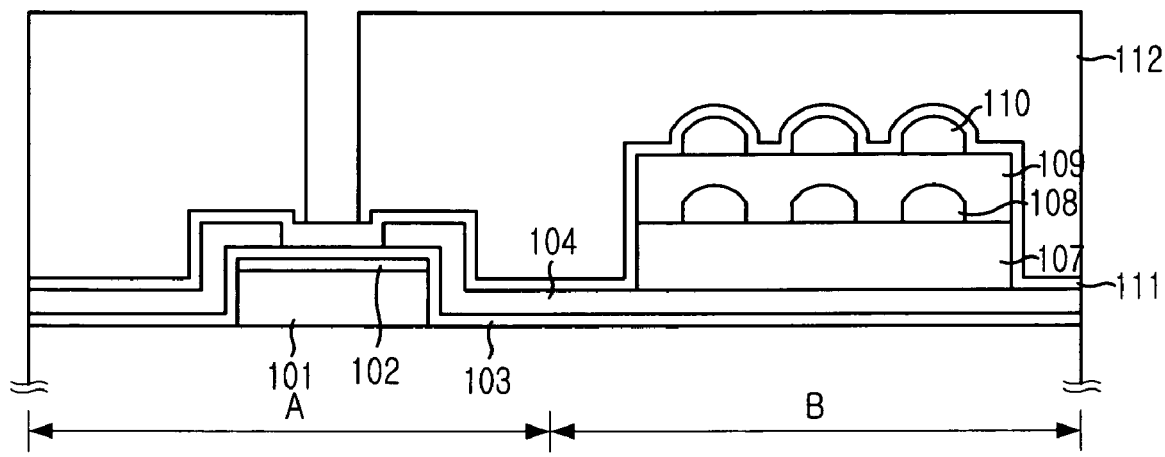
Figure 1D:
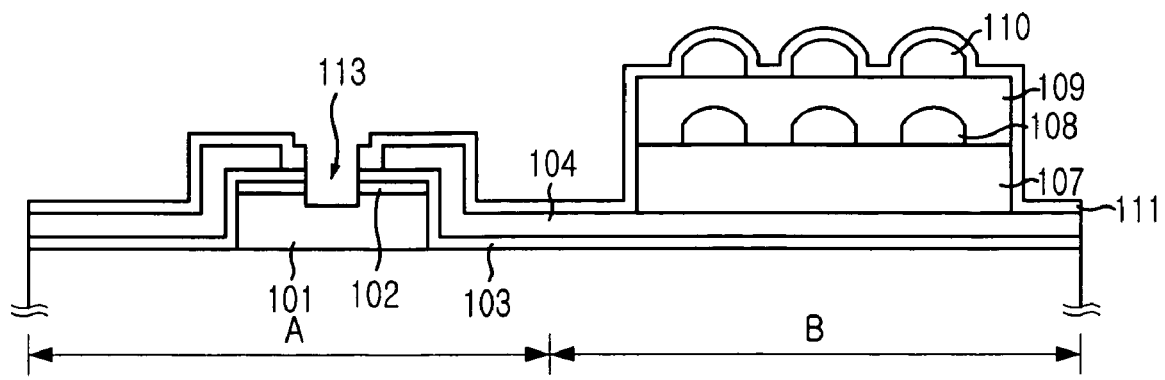
Figure 2:
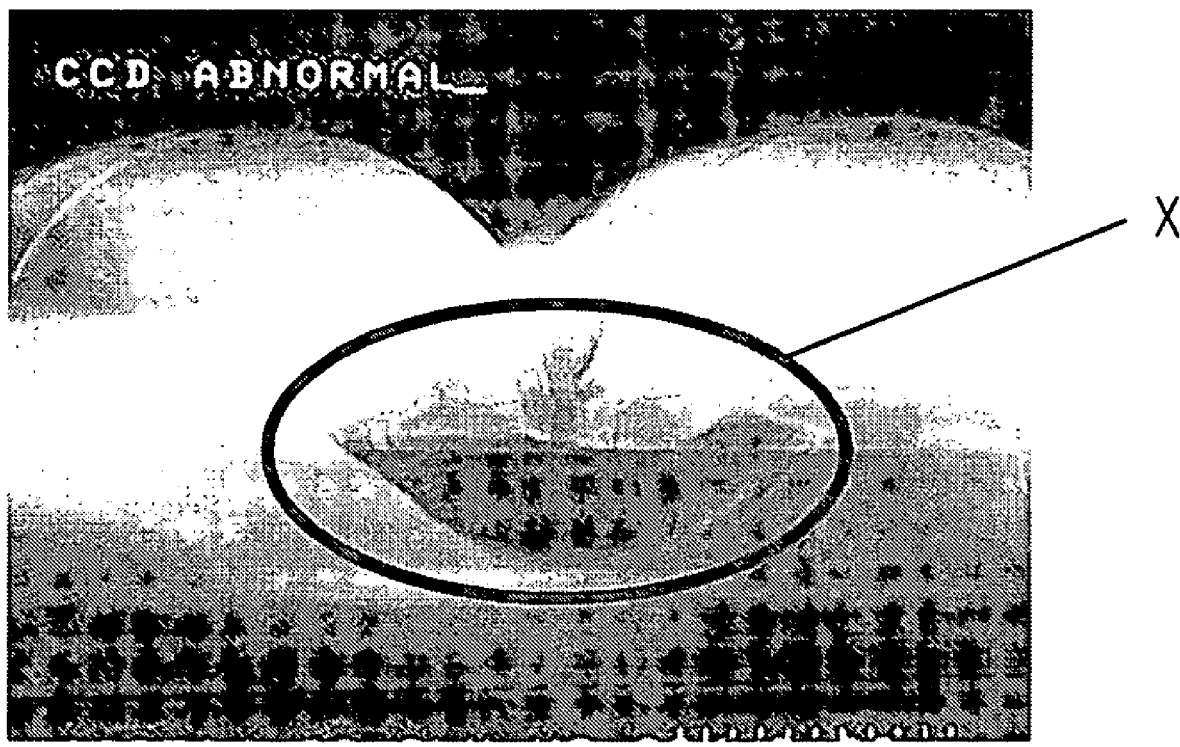
FIG. 2 illustrates a micrographic view of damage generated in a typical micro lens.
Figure 3A:
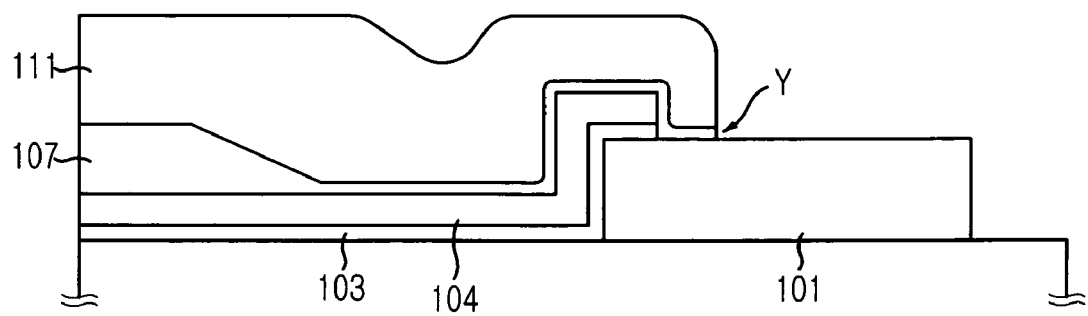
FIGS. 3A and 3B illustrate cross-sectional views of a peeling of a typical LTO layer generated during a plasma treatment for removing a photoresist pattern.
Figure 3B:
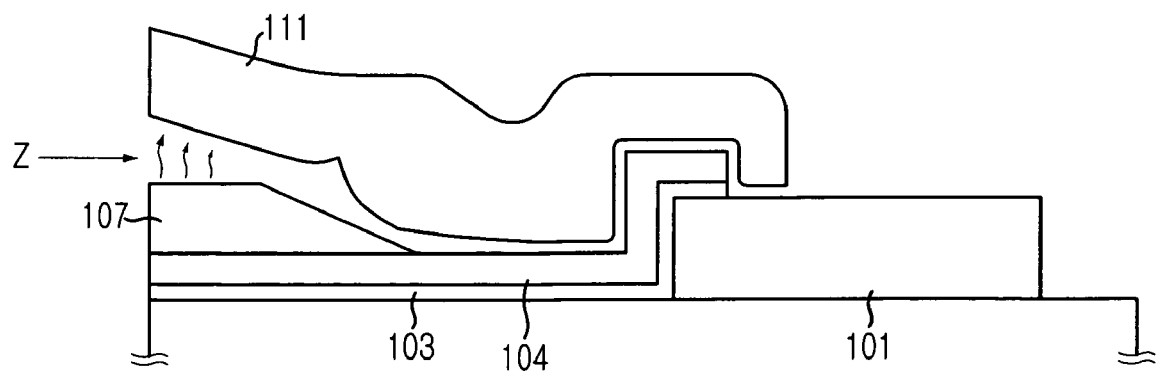

A method for fabricating an image sensor without an LTO-based passivation layer in accordance with exemplary embodiments of the present invention will be described in detail with reference to the accompanying drawings. Furthermore, identical or like reference numerals through out the exemplary embodiments of the present invention represent identical or like elements in different drawings.

FIGS. 4A to 4G illustrate cross-sectional views to describe a process for forming a pad of an image sensor in accordance with a specific embodiment of the present invention.

Figure 4A:
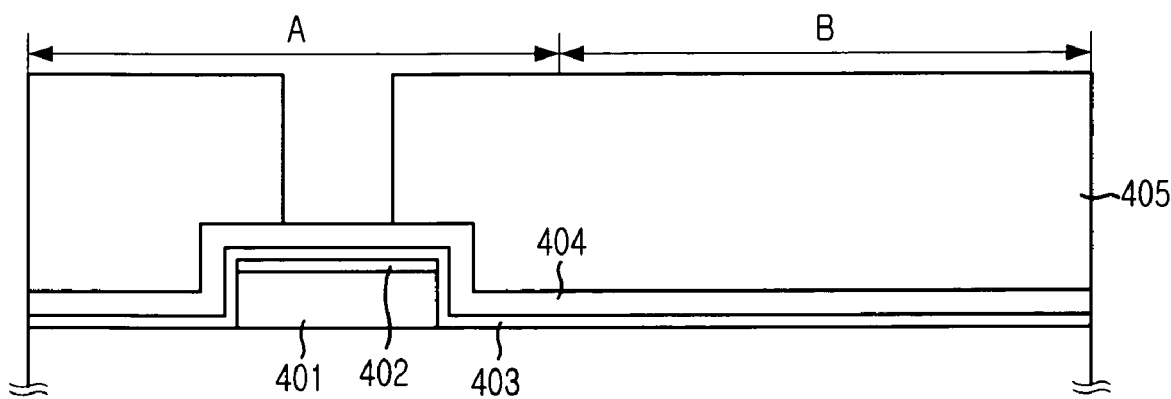
FIGS. 4A to 4G illustrate cross-sectional views to describe a process for forming a pad of an image sensor in accordance with a specific embodiment of the present invention.

Referring to FIG. 4A, a metal line 401 is formed over a bottom structure (not shown). The bottom structure includes various elements for configuring an image sensor, such as photodiodes and transistors. The metal line 401 is the uppermost metal line contacting a pad, and includes a metal, e.g. aluminum (Al).

An etch stop layer 402 formed over the metal line 401 is patterned simultaneously when the metal line 401 is formed. The etch stop layer 402 is formed to stop etching during an etching process for forming a pad contact. The etch stop layer 402 includes a nitride-based layer.

An oxide-based layer 403 and a nitride-based layer 404 configuring a passivation layer are sequentially formed over the resultant substrate structure. The oxide-based layer 403 configuring the passivation layer at the bottom includes one selected from a group consisting of tetraethyl orthosilicate (TEOS) layer, formed by employing a plasma enhanced chemical vapor deposition (PECVD) method (hereinafter referred to as a PE-TEOS layer), an undoped silicate glass (USG) layer, and a fluorine doped silicate glass (FSG) layer. The nitride-based layer 404 includes one of silicon nitride ($Si_3N_4$) and silicon oxynitride (SiON). The passivation layer may include a stack structure of the oxide-based layer 403 and the nitride-based layer 404 or a single layer structure.

A photoresist pattern 405 for forming the pad is formed over the nitride-based layer 404. Reference letter 'A' represents a pad region, and reference letter 'B' represents a unit pixel region.

Figure 4B:
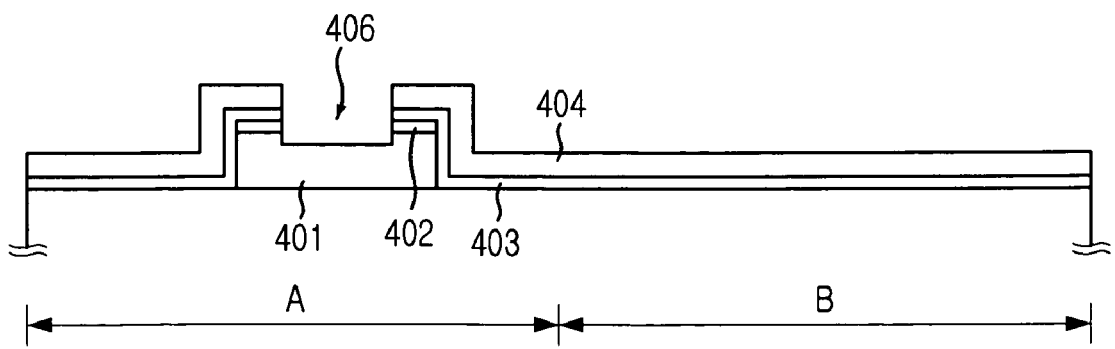

Referring to FIG. 4B, the nitride-based layer 404, the oxide-based layer 403, and the etch stop layer 402 are etched using the photoresist pattern 405 as an etch mask to form an opening 406 defining a region where the pad is to be formed, i.e., a pad region. An ashing process using oxygen ($O_2$) plasma is performed to remove the photoresist pattern 405. A cleaning process is performed.

Figure 4C:
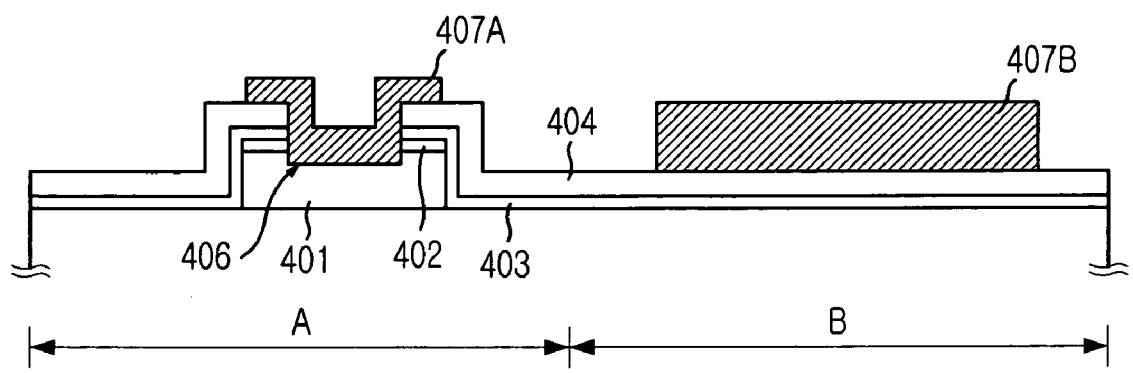

Referring to FIG. 4C, although not illustrated, a first over coating layer (OCL1) is formed over the resultant substrate structure. A selective etching process is performed thereon to form a patterned first over coating layer (OCL1) 407B over a region where subsequent color filters are to be formed in the unit pixel region B and an over coating layer (OCL) plug 407A covering the opening 406 in the pad region A.

The OCL1 includes negative photoresist. The OCL1 protects the metal line 401 exposed by the opening 406 because the OCL1 is generally not etched or damaged by an alkali-based developing solution, e.g., tetramethylammonium hydroxide (TMAH), often used in a developing process for forming a second over coating layer (OCL2).

Thus, the OCL1 may prevent photoresist, for use as color filters and micro lenses, from penetrating into grains of the damaged metal line 401. The OCL1 may have a thickness ranging from approximately 1,000 Å to approximately 20,000 Å.

Figure 4D:
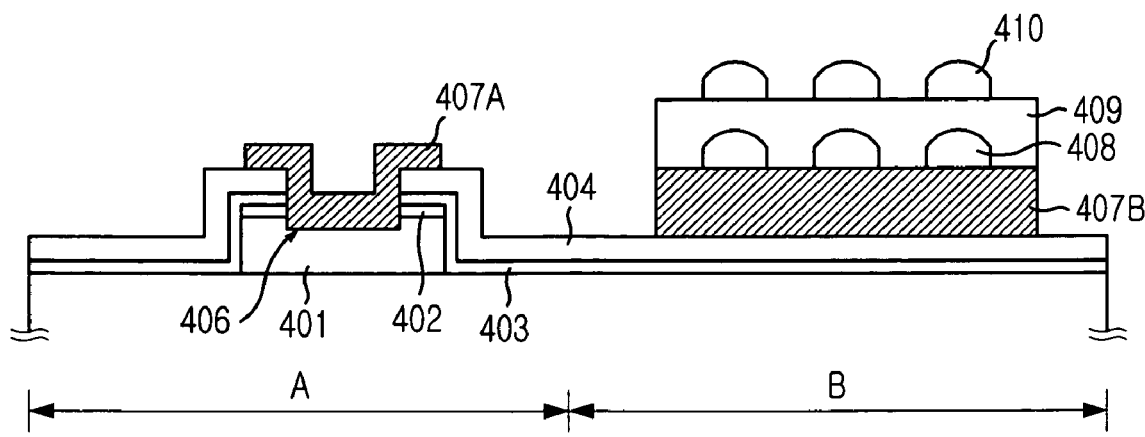

Referring to FIG. 4D, color filters 408, a second over coating layer (OCL2) 409, and micro lenses 410 are formed in the unit pixel region B. The color filters 408 may include RGB or YMgCy color filters. The micro lenses 410 are formed by forming a photoresist layer and performing developing and baking processes.

Meanwhile, if the OCL1 formation process is omitted, a color filter plug is formed over the opening 406 while forming a first color filter of the color filters 408. The color filter plug may function as the OCL plug 407A.

Figure 4E:
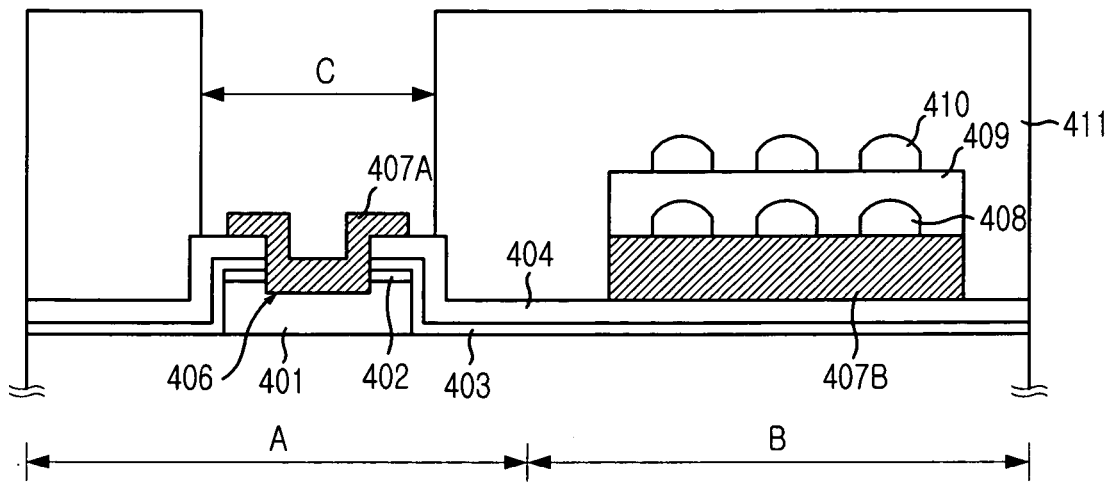

Referring to FIG. 4E, a photoresist pattern 411 widely exposing the pad region is formed. Reference letter 'C' denotes the widely exposed portion. The photoresist pattern 411 exposes the entire OCL plug 407A. The photoresist pattern 411 has a sufficient thickness to mask the micro lenses 410 after an etch-back process is performed to remove the OCL plug 407A. The photoresist pattern 411 generally needs to be removable by a solvent which is used in reworking a positive photoresist.

Figure 4F:
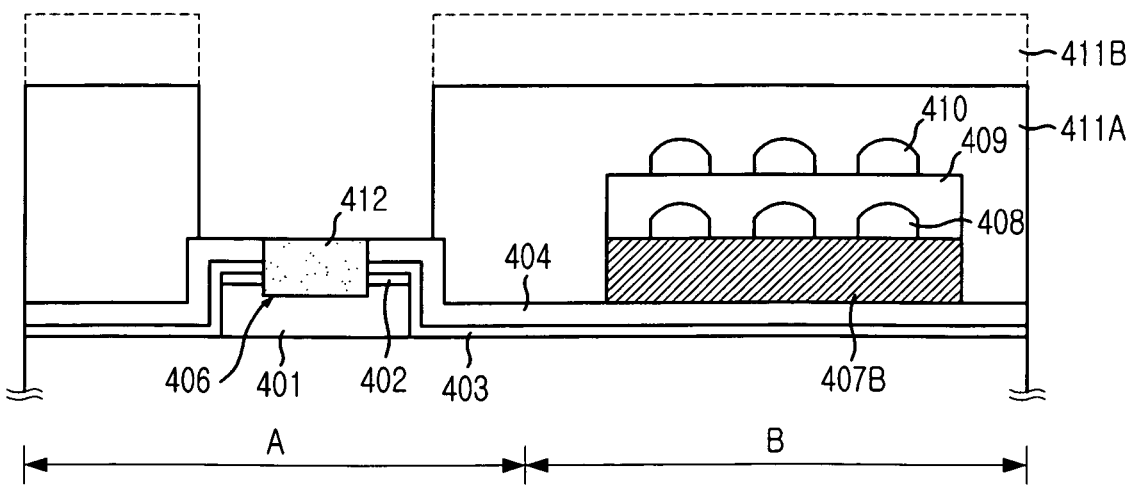

Referring to FIG. 4F, an etch-back process using $O_2$ plasma is performed to remove the OCL plug 407A. At this time, a portion of the photoresist pattern 411 is removed. Reference numeral 411B denotes the removed portion of the photoresist pattern 411, and reference numeral 411A denotes a remaining photoresist pattern.

Since the etch-back process using $O_2$ plasma removes the OCL plug 407A, a metal oxide layer 412 is formed over the exposed portion of the metal line 401. The metal oxide layer 412 is formed by a reaction between the metal and $O_2$. For example, if the metal line 401 includes aluminum (Al), aluminum oxide ($Al_2O_3$) is formed as the metal oxide layer 412.

The etch-back process may use $O_2$, nitrogen ($N_2$), or helium (He) as a plasma source. A plasma source having a temperature of approximately 100° C. or higher may cause hardening of photoresist. Thus, the temperature of a plasma etcher may range from approximately −20° C. to approximately 100° C.

Figure 4G:
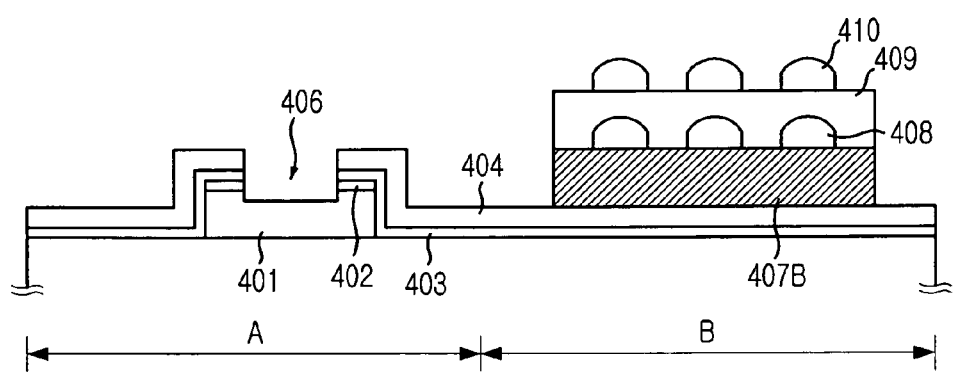

Referring to FIG. 4G, an aluminum (Al)-based metallic polymer generated on the metal line 401 during the etch-back process using $O_2$ plasma is removed using a weak base chemical or a weak acid chemical. The remaining photoresist pattern 411A is removed using a thinner photoresist stripper before or after the removal of the polymer.

When a plasma etching process using typical etchants such as tetrafluoromethane ($CF_4$) and fluoroform ($CHF_3$) is performed, the thinner photoresist stripper for positive photoresist may not be able to remove the remaining photoresist pattern 411A because of the polymer generated during the process, and damage and hardening of the remaining photoresist pattern 411A. However, the etch-back process using $O_2$ plasma does not generate damage and hardening of the remaining photoresist pattern 411A.

Meanwhile, the micro lenses 410 and the OCL2 409 are not removed or damaged because the micro lenses 410 and the OCL2 409 are hardened. Then, a thinner solvent treatment is performed. Thus, a selective removal of the remaining photoresist pattern 411A may be performed.

A cleaning process is performed to remove the metal oxide layer 412. The cleaning process uses acetic acid or tetramethylammonium hydroxide (TMAH) having a concentration of approximately 2.3%. A subsequent pad formation process is performed through the opening 406.

Figure 5:
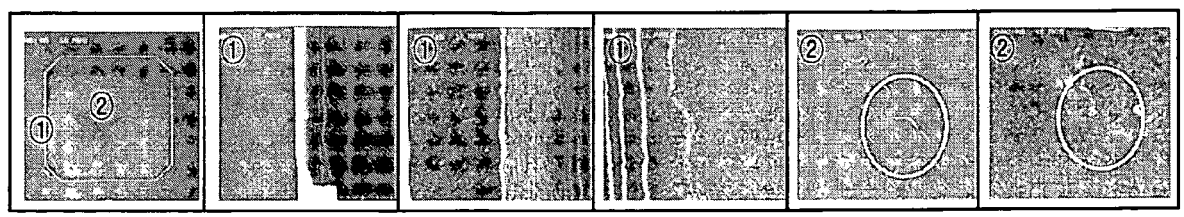
FIG. 5 illustrates micrographic views corresponding to processes described in FIG. 4E.

FIG. 5 illustrates micrographic views corresponding to the processes described in FIG. 4E. Reference numeral ① denotes a region where a pad is formed, and reference numeral ② denotes a region where micro lenses are formed. The micrographic views of the regions ① and ② are enlarged in the direction of the arrow.

Figure 6:
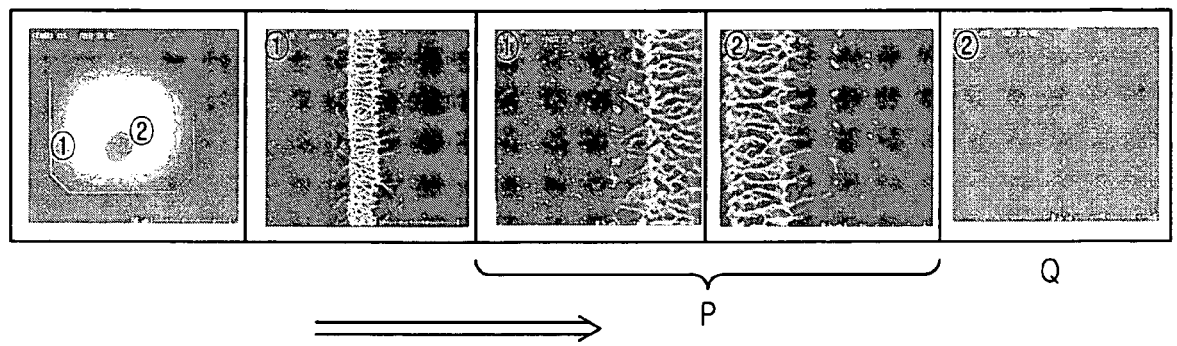
FIG. 6 illustrates micrographic views corresponding to processes described in FIG. 4F.

FIG. 6 illustrates micrographic views corresponding to the processes described in FIG. 4F. Reference numeral ① denotes a region where a pad is formed, and reference numeral ② denotes a region where micro lenses are formed. The micrographic views of the region ① are enlarged in the direction of the arrow. Reference letter 'P' denotes remaining portions of Al-based polymer generated by $O_2$ plasma. Reference letter 'Q' denotes a fully exposed metal line after an OCL plug is removed.

Figure 7:
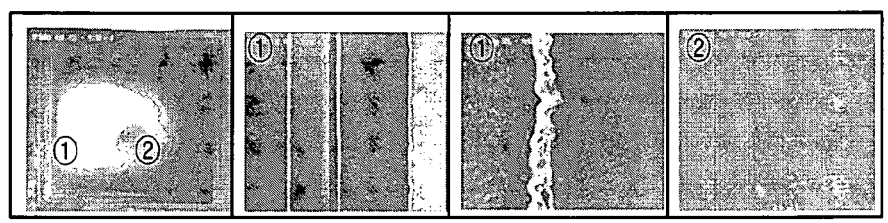
FIGS. 7 and 8 illustrate micrographic views after processes described in FIG. 4G are performed.
Figure 8:
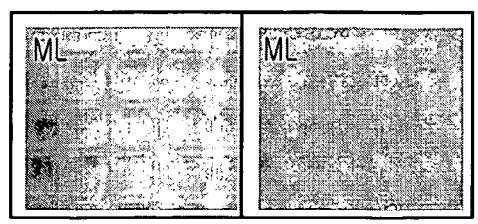

FIGS. 7 and 8 illustrate micrographic views after the processes described in FIG. 4G are performed.

FIG. 7 illustrates a region where a pad is formed. Reference numeral ① denotes a region where a pad is formed, and reference numeral ② denotes a region where micro lenses are formed. The picture on the far right shows a normal pad formed after the processes described in FIG. 4G are performed.

FIG. 8 illustrates a unit pixel region where micro lenses ML are formed. A photoresist pattern is removed by a thinner strip, and the micro lenses are generally protected from damage during a pad patterning process without using a LTO layer.

Consistent with this embodiment, the micro lenses are substantially protected from damage during the pad contact process performed without using the LTO layer, i.e., the passivation layer. Thus, defects related to a peeling of the LTO layer and increased light channel caused by the LTO layer may be reduced.

Consistent with this embodiment, defect generation may be decreased and a light receiving efficiency may be increased in an image sensor to improve yield and performance.

The present application contains subject matter related to the Korean patent application No. KR 2005-0083683, filed in the Korean Patent Office on Sep. 8, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating an image sensor comprising a first region, which is a light receiving region, and a second region, which is a pad region, the method comprising:
    forming a metal line in the second region over a substrate structure comprising a photodiode;
    forming a passivation layer over the substrate structure;
    selectively etching the passivation layer to form an opening exposing the metal line where a pad contact is to be formed;
    forming a first over coating layer (OCL1) in the first region while forming an over coating layer (OCL) plug over the opening in the second region;
    forming color filters, a second over coating layer (OCL2), and micro lenses in sequential order over the OCL1 in the first region;
    forming a photoresist pattern exposing the OCL plug;
    performing an etch-back process to remove the OCL plug; and
    removing the photoresist pattern.

2. The method of claim 1, wherein forming the photoresist pattern comprises forming the photoresist pattern having a sufficient thickness to mask the micro lenses after the etch-back process is performed.

3. The method of claim 2, wherein performing the etch-back process comprises using a plasma method, the plasma method using a plasma source at a temperature ranging from approximately −20° C. to approximately 100° C.

4. The method of claim 3, wherein removing the photoresist pattern comprises performing a thinner solvent treatment for use in reworking a positive photoresist thinner.

5. The method of claim 3, wherein the plasma source comprises oxygen ($O_2$).

6. The method of claim 5, wherein performing the etch-back process comprises forming a metal oxide layer over the metal line after the OCL plug is removed.

7. The method of claim 3, wherein the plasma source comprises one of helium (He) and nitrogen ($N_2$).

8. The method of claim 1, wherein forming the OCL1 comprises forming the OCL1 having a thickness ranging from approximately 1,000 Å to approximately 20,000 Å.

9. The method of claim 1, wherein forming the micro lenses comprises omitting a process of forming low temperature oxide (LTO) layer onto the micro lenses.

10. The method of claim 1, further comprising, after removing the photoresist pattern, a cleaning process.

11. The method of claim 10, wherein the cleaning process comprises using one of acetic acid and tetramethylammonium hydroxide (TMAH) having a concentration of approximately 2.3%.

12. The method of claim 1, wherein the passivation layer comprises a stack structure including an oxide-based layer and a nitride-based layer.

13. A method for fabricating an image sensor comprising a first region, which is a light receiving region, and a second region, which is a pad region, the method comprising:

forming a metal line in the second region over a substrate structure comprising a photodiode;

forming a passivation layer over the substrate structure;

selectively etching the passivation layer to form an opening exposing the metal line where a pad contact is to be formed;

forming color filters over the passivation layer in the first region and forming a color filter plug over the opening in the second region while forming a first color filter of the color filters;

sequentially forming an over coating layer (OCL) and micro lenses over the color filters in the first region;

forming a photoresist pattern exposing the color filter plug;

performing an etch-back process to remove the color filter plug; and removing the photoresist pattern.

14. The method of claim 13, wherein forming the photoresist pattern comprises forming the photoresist pattern having a sufficient thickness to mask the micro lenses after the etch-back process is performed.

15. The method of claim 14, wherein performing the etch-back process comprises using a plasma method, the plasma method using a plasma source at a temperature ranging from approximately −20° C. to approximately 100° C.

16. The method of claim 15, wherein removing the photoresist pattern comprises performing a thinner solvent treatment for use in reworking a positive photoresist thinner.

17. The method of claim 15, wherein the plasma source comprises oxygen ($O_2$).

18. The method of claim 17, wherein performing the etch-back process comprises forming a metal oxide layer over the metal line after the color filter plug is removed.

19. The method of claim 15, wherein the plasma source comprises one of helium (He) and nitrogen ($N_2$).

20. The method of claim 13, wherein forming the micro lenses comprises omitting a process of forming low temperature oxide (LTO) layer onto the micro lenses.

* * * * *